US012676610B2

(12) United States Patent
    Herr

(10) Patent No.: US 12,676,610 B2
(45) Date of Patent: Jul. 7, 2026

(54) SWITCH CIRCUIT WITH SOFT START AND SWITCH CONTROL CIRCUIT AND METHOD THEREOF

(71) Applicant: Richtek Technology Corporation, Hsinchu (TW)

(72) Inventor: James Herr, San Jose, CA (US)

(73) Assignee: Richtek Technology Corporation, Hsinchu (TW)

( * ) Notice: Subject to any disclaimer, the term of this patent is extended or adjusted under 35 U.S.C. 154(b) by 31 days.

(21) Appl. No.: 19/007,598

(22) Filed: Jan. 2, 2025

(65) Prior Publication Data

US 2026/0058650 A1      Feb. 26, 2026

Related U.S. Application Data

(60) Provisional application No. 63/685,723, filed on Aug. 22, 2024.

(51) Int. Cl.
    *H03K 17/28*          (2006.01)
(52) U.S. Cl.
    CPC .................................... *H03K 17/28* (2013.01)
(58) Field of Classification Search
    CPC ...................................................... H03K 17/28
    USPC .......................................................... 327/392
    See application file for complete search history.

(56) References Cited

U.S. PATENT DOCUMENTS

| | | | | |
|---|---|---|---|---|
| 10,826,288 | B1 * | 11/2020 | Chien .................... | H02H 9/002 |
| 11,107,509 | B1 * | 8/2021 | Majerus ................. | G11C 16/26 |
| 12,095,358 | B2 * | 9/2024 | Fan ......................... | H02M 3/07 |
| 2009/0284237 | A1 * | 11/2009 | Kitagawa .............. | H02M 3/156 |
| | | | | 323/282 |
| 2012/0313606 | A1 * | 12/2012 | Jung ........................ | G05F 1/56 |
| | | | | 323/283 |
| 2018/0109194 | A1 * | 4/2018 | Peng .................. | H05B 45/3725 |
| 2023/0231469 | A1 * | 7/2023 | Lee ........................ | H02M 3/158 |
| | | | | 323/271 |

* cited by examiner

*Primary Examiner* — Tomi Skibinski
(74) *Attorney, Agent, or Firm* — Huan-Yi Lin

(57)                ABSTRACT

A switch control circuit, for controlling a path switch and a current sense resistor connected in series between an input voltage and an output voltage, includes: an amplifier, which controls the gate voltage of the path switch based on a voltage drop across the current sense resistor to perform current-limited soft start; a slope detection circuit, coupled to the output voltage, for monitoring the rising slope of the output voltage; and a pull-down switch, coupled between the gate of the path switch and a disabling potential. When the slope detection circuit detects that a rising slope of the output voltage is below a preset slope threshold, the pull-down switch is triggered to conduct, thereby turning off the path switch.

16 Claims, 8 Drawing Sheets

300

SWITCH CIRCUIT WITH SOFT START AND SWITCH CONTROL CIRCUIT AND METHOD THEREOF

CROSS REFERENCE

The present invention claims priority to U.S. 63/685,723 filed on Aug. 22, 2024.

BACKGROUND OF THE INVENTION

Field of Invention

The present invention relates to a switch circuit, specifically to a switch circuit for hot-swap applications. The present invention also relates to its switch control circuit and control method. The present invention enables effective soft-start operation and reduces the Safe Operating Area (SOA) requirements for the path switch within the switch circuit.

Description of Related Art

In hot swap applications, implementing a soft-start mechanism is crucial for minimizing disturbances to the back-plane power supply and reducing the Safe Operating Area (SOA) demands on the inline power switch, typically an N-type MOSFET. By gradually charging a large output capacitor with controlled, moderate current, the stress exerted on the MOSFET can be reduced by utilizing the MOSFET's heat-sinking metal components and PCB traces to dissipate heat effectively.

FIG. 1 and FIG. 2 respectively show diagrams of two primary prior art soft-start methods widely used: the gate voltage slope control method and the current limit method.

FIG. 1 illustrates a prior art multi-phase switch circuit that employs the gate voltage slope control soft-start method. The multi-phase switch circuit 100 includes multiple switch circuits (e.g., switch circuits 51 and 52) coupled in parallel between the input voltage VIN and the output voltage VOUT. Each switch circuit includes a path switch SP placed between the input voltage VIN and the output voltage VOUT to control current flow. In this implementation, the path switch's gate voltage VG is gradually charged using a controlled slope, enabling a soft start. Since the path switch SP is an NMOSFET, a charge pump (Charge Pump 28) is configured to provide the necessary gate voltage, while a current source (Current Source 38) supplies a constant charging current ICH. This configuration ensures VG of each path switch has a stable rising slope, enabling soft-start functionality.

In the gate voltage slope control method, the gate of the MOSFET is gradually charged by a constant current source, which causes the source terminal (connected to the output capacitor Co) to rise with the gate potential offset by a threshold voltage drop. The soft-start current ISS through the MOSFET and into Co is given by the equation:

$$ISS=(dVOUT/dt)\times Co$$

The soft-start current ISS is generally set below the current limit threshold, allowing for quick termination of the soft-start operation if an output short condition is detected. By halting the soft start as soon as the current threshold is reached, stress on the MOSFET is minimized, thereby reducing SOA demands. However, variations in the MOSFET threshold voltage among multiple devices can create discrepancies in current sharing when devices are connected in parallel. Consequently, the gate voltage slope control method has limited current-sharing accuracy in such configurations.

FIG. 2 shows a schematic diagram of another prior art switch circuit, illustrating the current limit soft-start method. The multi-phase switch circuit 200 includes multiple switch circuits (e.g., switch circuits 53 and 54). Each switch circuit, such as switch circuit 53, includes a path switch SP and a current sense resistor RSNS connected in series between VIN and VOUT. Each switch circuit also contains an amplifier (Amplifier 48) with an offset voltage VOS connected across RSNS to sense the current through the path switch SP. The output of the amplifier controls the gate voltage VG of the path switch SP, using a feedback control manner, to achieve a fixed current during soft start by controlling the current flow through RSNS.

In the current limit method, the gate voltage VG is adjusted to maintain a constant current, usually set to a low level (e.g., 10% of the maximum load current) to reduce SOA requirements. By setting an extended soft-start duration, the output capacitor can be fully charged with adequate tolerance for variations in the current limit accuracy and capacitor values. This approach provides better current-sharing accuracy for parallel devices compared to the gate voltage slope control method, as it is unaffected by variations in MOSFET threshold voltages.

However, the long soft-start time poses a drawback under fault conditions such as output shorts. Because the current limit is active during both normal and fault conditions, the system cannot distinguish between these states, preventing the soft-start time from being reduced. Prolonged power dissipation and temperature rise on the path switch SP can result, increasing the risk of failure under sustained fault conditions.

In view of the above, to overcome the drawbacks of the prior art, the present invention proposes a method and a circuit designed to address these issues. The switch circuit according to the present invention can achieve high accuracy current balance during soft start while being capable of disabling the path switch with a short response time, preventing damage during output load fault and keeps less stringent SOA requirements.

SUMMARY OF THE INVENTION

According to one perspective, the present invention provides a switch control circuit for controlling a path switch and a current sensing resistor connected in series between an input voltage and an output voltage. The switch control circuit comprises: an amplifier that controls the gate voltage of the path switch based on the voltage drop across the current sensing resistor to perform current-limited soft start; a slope detection circuit coupled to the output voltage for monitoring the rising slope of the output voltage; and a pull-down switch connected between the gate of the path switch and a disabling potential; wherein, when the slope detection circuit detects that the rising slope of the output voltage is below a predetermined slope threshold, the pull-down switch is triggered to conduct, thereby turning off the path switch.

In a preferred embodiment, the switch control circuit further includes a charge pump that, after completing the soft start, raises the gate voltage of the path switch to a high potential generated by the charge pump, thereby fully turning on the path switch.

In a preferred embodiment, the slope detection circuit includes an analog-to-digital converter (ADC) coupled to the output voltage to convert the output voltage into a digital signal; and a logic circuit that calculates the rising slope of the output voltage based on the digital signal and compares the rising slope with the predetermined slope threshold to generate a control signal for controlling the pull-down switch.

In a preferred embodiment, the switch control circuit allows the rising slope of the output voltage to be below the predetermined slope threshold within a predetermined time window, thereby achieving a deglitch function.

In a preferred embodiment, upon detecting that the rising slope of the output voltage is below the predetermined slope threshold and turning off the path switch, the switch control circuit attempts to re-initiate the soft start after a predetermined time delay.

In a preferred embodiment, the switch control circuit counts and records the number of soft-start re-attempts, and when the number of re-attempts reaches a predetermined limit, maintains the path switch in an off state.

According to another perspective, the present invention provides a switch circuit comprising: a path switch and a current sensing resistor connected in series between an input voltage and an output voltage; and a switch control circuit, including an amplifier that controls the gate voltage of the path switch based on the voltage drop across the current sensing resistor to perform current-limited soft start; a slope detection circuit coupled to the output voltage for monitoring the rising slope of the output voltage; and a pull-down switch connected between the gate of the path switch and a disabling potential; wherein, when the slope detection circuit detects that the rising slope of the output voltage is below a predetermined slope threshold, the pull-down switch is triggered to conduct, thereby turning off the path switch.

According to yet another perspective, the present invention provides a method for controlling a path switch connected in series between an input voltage and an output voltage. The method includes: controlling the gate voltage of the path switch to perform a current-limited soft start of the output voltage; monitoring the rising slope of the output voltage; comparing the monitored rising slope with a predetermined slope threshold; and turning off the path switch when the rising slope is lower than the predetermined slope threshold.

In a preferred embodiment, the method further includes: allowing the rising slope to be lower than the slope threshold within a predetermined time window during the soft-start process to achieve a deglitch function.

In a preferred embodiment, after turning off the path switch due to the rising slope being lower than the predetermined slope threshold, the method further includes: attempting to re-initiate the soft start after a predetermined time delay.

In a preferred embodiment, the method further includes: counting and recording the number of soft-start re-attempts; and maintaining the path switch in an off state when the number of re-attempts reaches a predetermined limit.

The objectives, technical details, features, and effects of the present invention will be better understood with regard to the detailed description of the embodiments below, with reference to the attached drawings.

4

Figure 1:
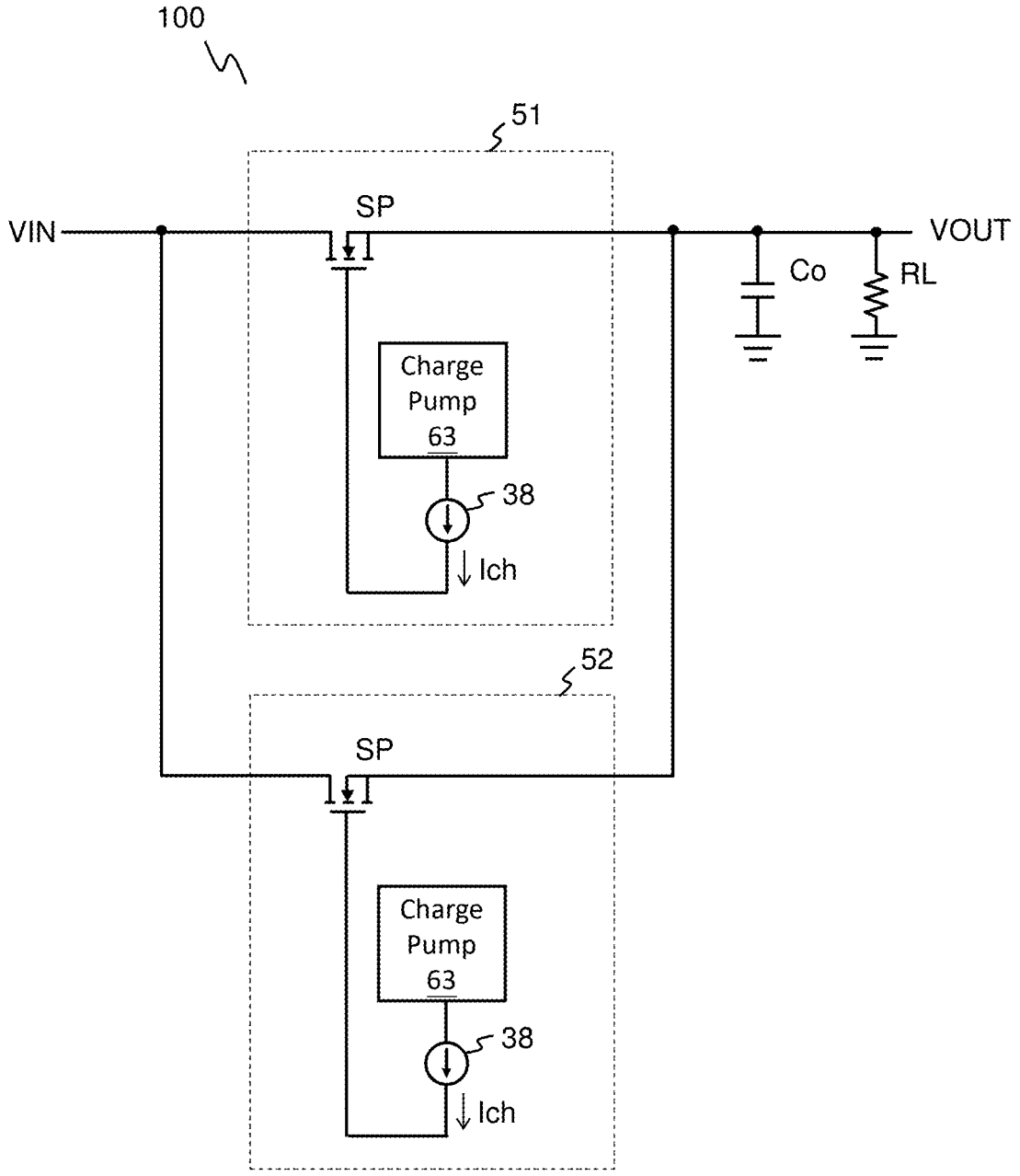
FIG. 1 shows a schematic diagram of a prior art switch circuit.
Figure 2:
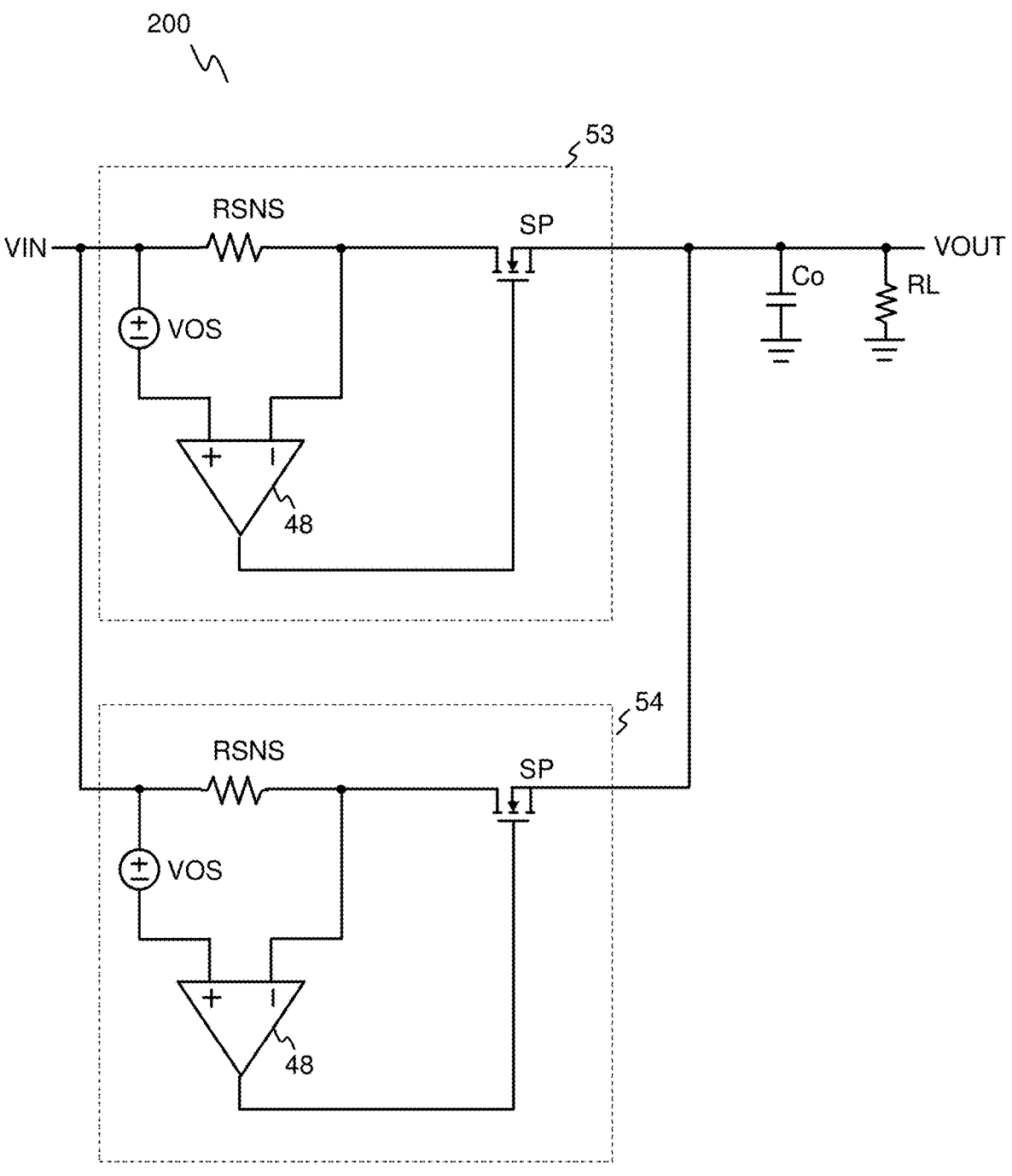

FIG. 2 shows a schematic diagram of another prior art switch circuit.

Figure 3:
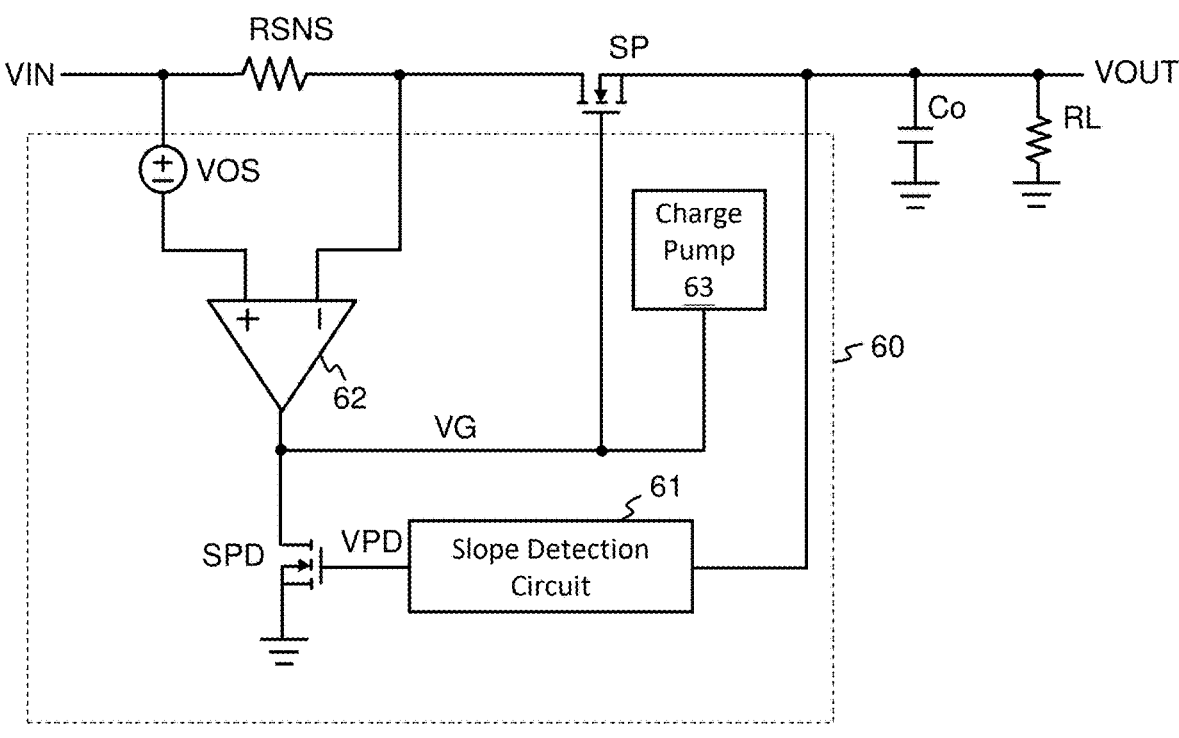

FIG. 3 shows a schematic diagram of a switch circuit according to one embodiment of the present invention.

Figure 4:
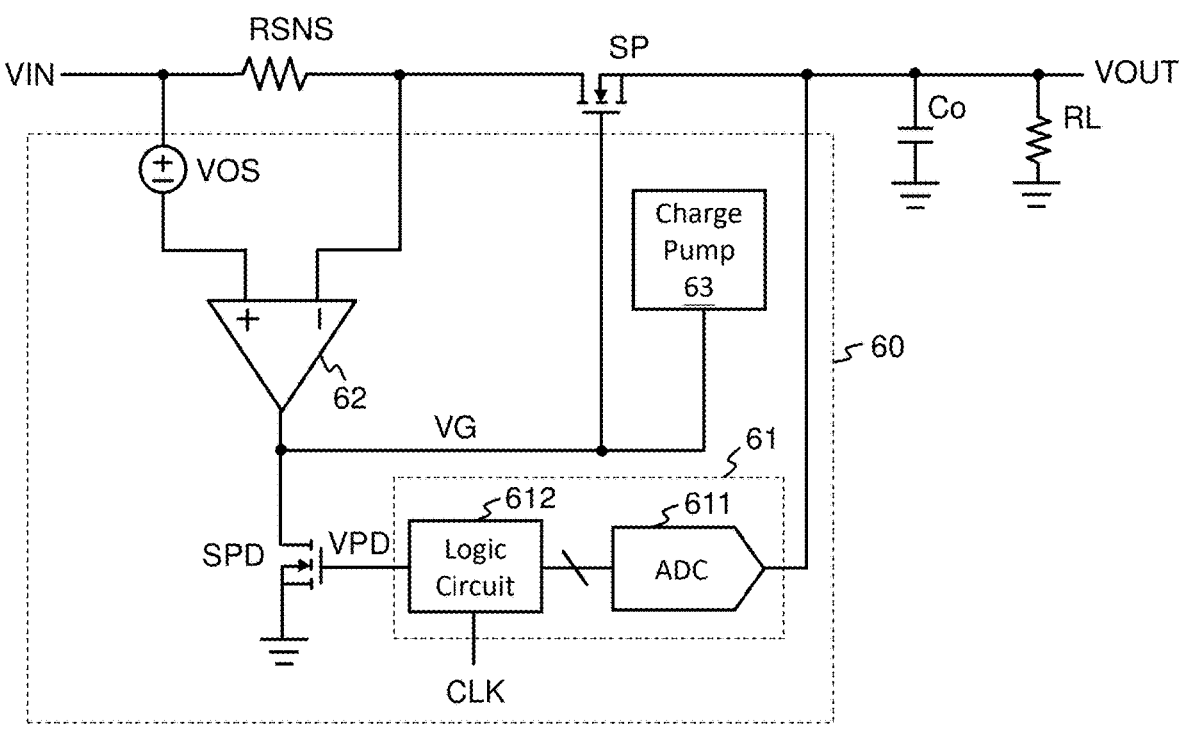

FIG. 4 shows a more detailed embodiment of the switch circuit corresponding FIG. 3 according to the present invention.

Figure 5:
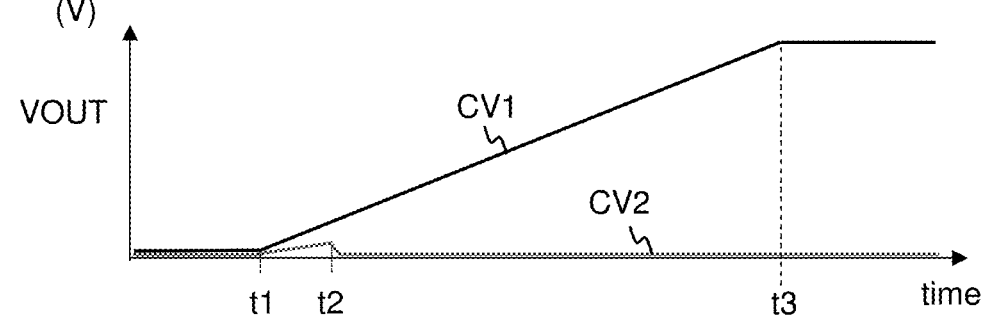
Figure 5:
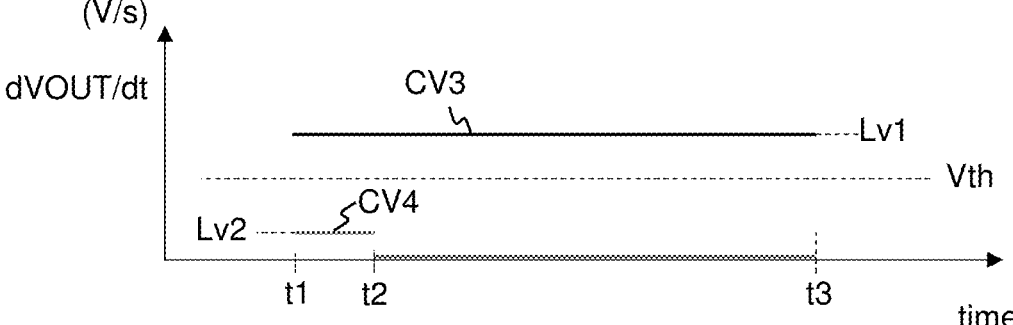

FIG. 5 shows an operational waveform diagram of one embodiment of the present invention, displaying the normal state and soft-start failure condition.

Figure 6:
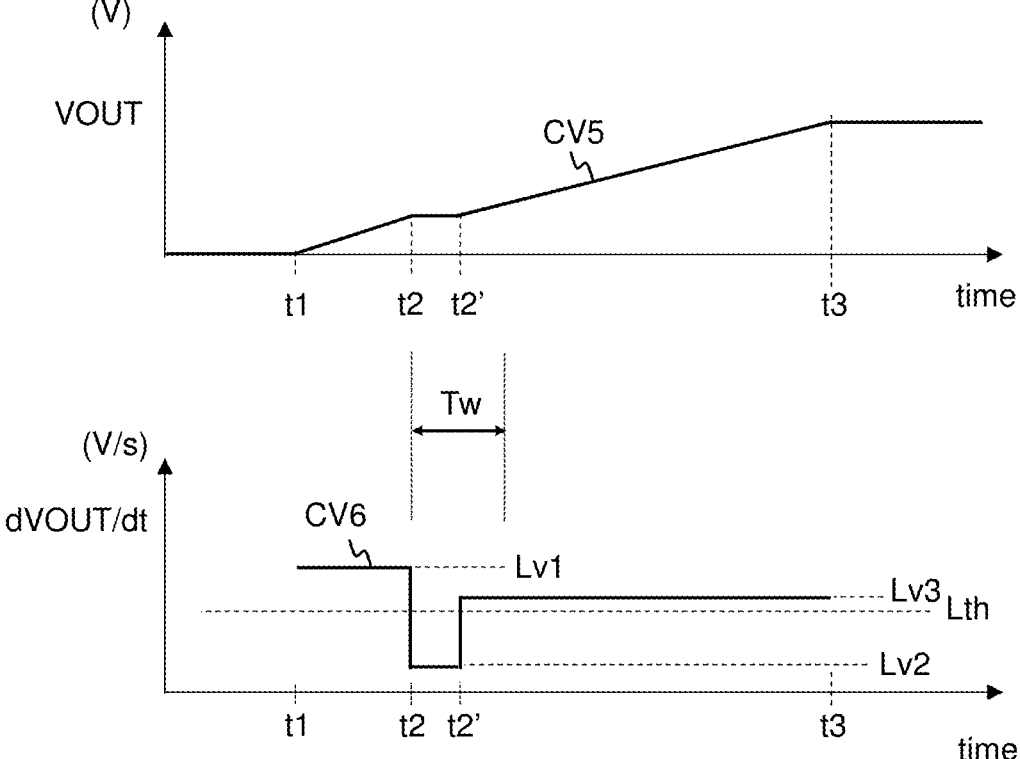

FIG. 6 shows an operational waveform diagram of another embodiment of the present invention, displaying the soft-start condition with a deglitching function.

Figure 7:
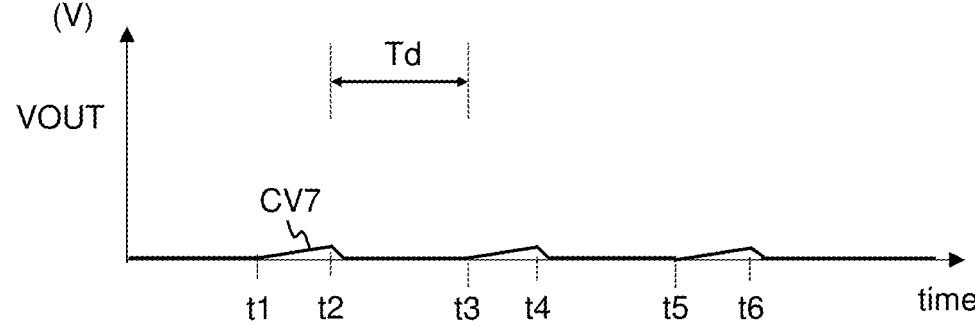
Figure 7:
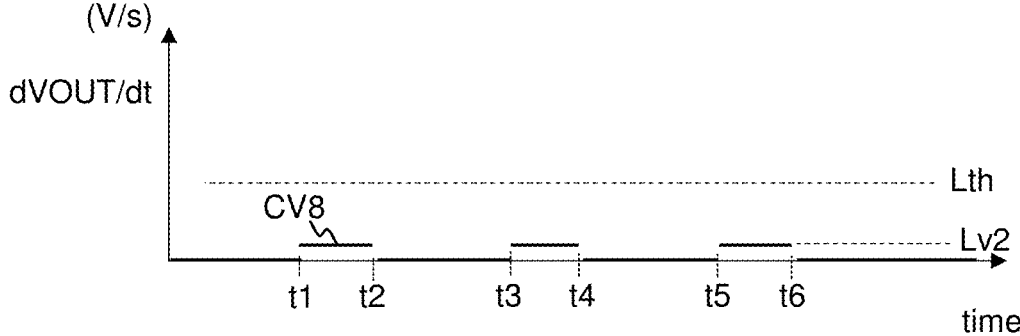

FIG. 7 shows an operational waveform diagram of an embodiment of the present invention with a re-attempt function.

Figure 8:
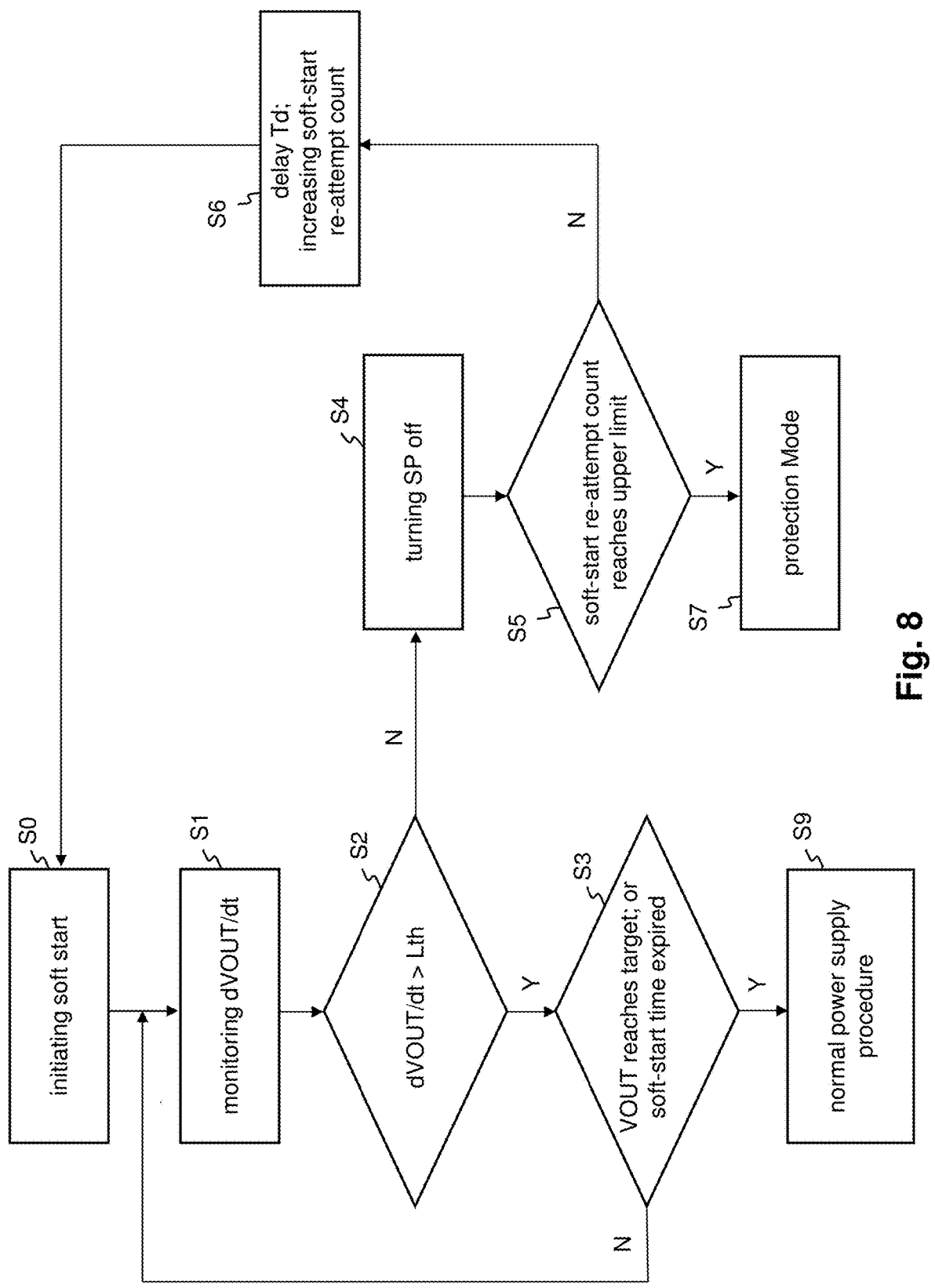

FIG. 8 shows a flowchart of the operation of the present invention.

DESCRIPTION OF THE PREFERRED
EMBODIMENTS

The drawings as referred to throughout the description of the present invention are for illustration only, to show the interrelations between the circuits and the signal waveforms, but not drawn according to actual scale of circuit sizes and signal amplitudes and frequencies.

FIG. 3 shows a schematic diagram of a switch circuit according to one embodiment of the present invention. The switch circuit 300 comprises a path switch SP and a current sensing resistor RSNS which are connected in series between the input voltage VIN and the output voltage VOUT, and a switch control circuit 60. The switch control circuit 60 includes an amplifier 62, a charge pump 63, a pull-down switch SPD, and a slope detection circuit 61. The amplifier 62 has an offset VOS and is configured to adjust the gate voltage VG of the path switch SP based on the voltage drop across the current-sensing resistor RSNS and the offset VOS, thereby achieving a current-limited soft start for the output voltage VOUT.

The output of the charge pump 63 is connected to the gate voltage VG to elevate VG to a higher level during the final stage of the soft start, allowing the path switch SP to fully turn on. The slope detection circuit 61 senses the rising slope dVOUT/dt of the output voltage VOUT and generates a pull-down control signal VPD. The pull-down switch SPD is coupled between the gate voltage VG and ground. When the pull-down control signal VPD initiates pull-down control, the pull-down switch SPD pulls the gate voltage VG to a disable level (e.g., ground), thereby turning off the path switch SP.

In one embodiment, when the slope detection circuit 61 detects that the rising slope dVOUT/dt of the output voltage VOUT is lower than a preset slope threshold Lth, it activates the pull-down control signal VPD, which turns on the pull-down switch SPD and lowers the gate voltage VG, thus turning off the path switch SP. Under current-limiting conditions, if the current supplied to the output capacitor Co and load is insufficient to allow the output voltage VOUT to rise at the preset slope, the slope detection circuit 61 can determine that a fault, such as a load short circuit, may have occurred, and thereby triggers the pull-down switch SPD to turn off the path switch SP. It is noteworthy that while this embodiment illustrates a single switch circuit, the invention is equally applicable to applications with multiple parallel switch circuits, achieving precise current sharing during soft start.

FIG. 4 shows a more detailed embodiment of the switch circuit corresponding FIG. 3 according to the present invention. In this embodiment, the slope detection circuit 61 includes an analog-to-digital converter (ADC) 611 and a logic circuit 612.

The analog-to-digital converter 611 is coupled to the output voltage VOUT to convert VOUT into a corresponding digital signal, reflecting the potential of the output voltage. The logic circuit 612 calculates the rising slope dVOUT/dt of the output voltage VOUT based on the digital signal generated by the ADC 611 and the clock signal CLK, and compares the rising slope dVOUT/dt to a preset slope threshold Lth. When the logic circuit 612 detects that the slope dVOUT/dt of the output voltage VOUT is lower than the preset slope threshold Lth, it generates a pull-down control signal VPD, which in turn activates the pull-down switch SPD to turn off the path switch SP. This scheme enables a rapid response when the rising slope of the output voltage is insufficient, thereby preventing potential faults, such as load short circuits.

FIG. 5 shows an operational waveform diagram of one embodiment of the present invention, displaying the normal state and soft-start failure condition. The upper part of FIG. 5 illustrates waveforms of the output voltage VOUT under normal conditions (CV1) and fault conditions (CV2). The lower part shows the corresponding rising slopes of the output voltage VOUT, with CV3 representing the normal state and CV4 representing the fault state.

In the normal state, the switch control circuit 60 initiates the soft-start process some time before time t1 and the output voltage VOUT starts to ramp up at time t1, as shown in waveforms CV1 and CV3. During the soft-start period from t1 to t3, the output voltage VOUT rises steadily with a slope of LV1, where LV1 is greater than the preset slope threshold Lth. As a result, the slope detection circuit 61 determines this as a normal soft-start condition. Furthermore, upon completing the soft start at time t3, the output voltage has reached the preset target level, and the switch control circuit 60 raises the gate voltage VG to a higher level, allowing the path switch SP to fully conduct.

In the fault condition, the switch control circuit 60 initiates the soft start at time t1, as shown in waveforms CV2 and CV4. However, due to the insufficient rising slope of the output voltage VOUT, with a slope value of LV2 that is below the preset slope threshold Lth, the switch control circuit 60 pulls the gate voltage VG down to zero at time t2, shutting off the path switch SP. Consequently, the output voltage VOUT drops to a low level after time t2. It is noted that the rising slope of the output voltage outside the t1 to t3 period is irrelevant and, therefore, is not illustrated.

FIG. 6 shows an operational waveform diagram of another embodiment of the present invention, illustrating a soft-start condition with a deglitching function. The top half of FIG. 6 displays the output voltage VOUT waveform CV5, and the lower half displays the corresponding slope of VOUT, referred to as CV6. Starting from time t1, the switch control circuit initiates the soft start. During the period from t1 to t2, the output voltage VOUT rises at a fixed slope, LV1, which is higher than the preset slope threshold Lth, indicating a successful soft-start operation.

Beginning at time t2, the slope of the output voltage VOUT decreases to a gentler value, LV2, which is lower than the slope threshold Lth. In the previous embodiment shown in FIG. 5, a slope below Lth would be deemed a fault, causing the soft start to terminate. However, in this embodiment, as illustrated in FIG. 6, a deglitching function is incorporated, allowing the switch control circuit to tolerate short-term drops below the slope threshold Lth.

Specifically, due to load transient or other factors, during the period from t2 to t2', the slope LV2 of the output voltage VOUT falls below Lth shortly. Nevertheless, because of the deglitching function, the switch control circuit permits the slope to remain below Lth temporarily within a preset time window, Tw. As a result, the soft start continues.

Starting at time t2', the slope of the output voltage VOUT resumes a value higher than Lth, designated as LV3, and continues until time t3, where VOUT reaches its final high level, completing the soft start successfully.

In this embodiment, by incorporating the deglitching function, the switch control circuit is insensitive to brief slope drops, avoiding erroneous fault detection due to transient disturbances. This feature enhances stability and fault tolerance of the system, ensuring a smooth soft-start process.

FIG. 7 shows an operational waveform diagram of an embodiment of the present invention with a re-attempt function. The top waveform CV7 displays the output voltage VOUT over time, including multiple restart attempts. The lower waveform CV8 represents the corresponding slope of VOUT, dVOUT/dt, over time.

At time t1, the switch control circuit initiates the first soft start, causing the output voltage VOUT to gradually rise as the gate voltage VG of the path switch SP increases. However, at time t2, the slope detection circuit 61 detects that the slope dVOUT/dt of the output voltage VOUT is below the preset slope threshold Lth. The switch control circuit interprets this as a potential fault, so it pulls VG to zero, turning off SP and lowering VOUT to a low level.

In this embodiment, after a predefined delay time Td, at time t3, the switch control circuit attempts a second soft start, causing VOUT to rise again. Since the slope dVOUT/dt is again detected to be below the threshold Lth at time T4, the switch control circuit repeats the process.

The switch control circuit can be configured with a maximum allowable re-attempt count (e.g., three attempts). If the retry count exceeds the specified limit, the switch control circuit maintains the off state.

FIG. 7 demonstrates how, when VOUT's slope falls below the threshold Lth, the switch control circuit in this embodiment can automatically retry multiple times, with each attempt separated by a delay time Td. This re-attempt mechanism enhances system reliability, allowing for automatic recovery from temporary faults or erroneous signals without user intervention, thereby increasing the fault tolerance of the switch circuit.

FIG. 8 shows a flowchart of the operation of the present invention. In step S0, the switch control circuit 60 initiates the soft start, causing the output voltage VOUT to rise as the gate voltage VG of the path switch SP increases. The circuit subsequently proceeds to step S1, where the slope detection circuit 61 continuously monitors the slope dVOUT/dt of the output voltage VOUT.

In step S2, the circuit compares the detected slope dVOUT/dt with the preset threshold Lth. If dVOUT/dt exceeds Lth, the circuit proceeds to step S3; if not, it proceeds to step S4. In step S3, it checks whether VOUT has reached the target level or the preset soft-start time limit. If not, it returns to step S1 to continue the soft-start process. If yes, the circuit proceeds to step S9, maintaining the path switch SP in the on-state to provide power to the load.

Conversely, in step S4, the gate voltage VG is pulled to zero, turning off the path switch SP. Subsequently, in step S5, it checks the re-attempt count. If the re-attempt count has not reached the maximum, it proceeds to step S6, where it waits for the delay time Td, increments the re-attempt counter n, and then returns to step S0 to attempt a restart. If the re-attempt counter n has reached the maximum count, the circuit proceeds to step S7, entering a protection mode where switch control circuit 60 remains off.

In one embodiment, certain steps of the process can be omitted, such as steps S5 and S6, eliminating the re-attempt function. In this configuration, if dVOUT/dt falls below Lth in step S4, the circuit directly advances to step S7.

Additionally, in another embodiment, step S2 can be replaced by step S2', where the slope dVOUT/dt is compared to Lth with the addition of a time window, Tw. If dVOUT/dt is greater than Lth, the circuit proceeds to step S3. If dVOUT/dt is below Lth for a duration exceeding Tw, it advances to step S4; otherwise, it proceeds to step S3.

FIG. 8 details the decision-making and operation process of switch control circuit 60 during the startup phase. Corresponding to the waveform shown in FIG. 7, the circuit retries multiple times upon detecting a fault, enhancing fault tolerance. Additionally, re-attempt count n and delay time Td can be adjusted by the user based on application requirements.

The present invention offers several advantages. First, using the current limit method, the circuit actively controls the MOSFET (i.e., SP) gate voltage, regulating the current to a fixed value during soft start. This approach provides improved current-sharing accuracy in applications where multiple switch circuits are paralleled for soft-starting large output capacitors, unaffected by MOSFET threshold variations. Second, the switch control circuit continuously monitors the slope of VOUT (dVOUT/dt), allowing for a rapid halt of the soft start upon fault detection, such as an output short. The response time can be reduced from several hundred milliseconds to a few milliseconds, significantly lowering the stress on the MOSFET and, consequently, reducing the safe operating area (SOA) requirement, which in turn lowers system costs. Additionally, by incorporating deglitch and re-attempt functions, the switch circuit exhibits fault tolerance, allowing for transient slope drops and multiple soft-start attempts, enhancing stability and reliability.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A switch control circuit for controlling a path switch and a current sense resistor connected in series between an input voltage and an output voltage, the switch control circuit comprising:

an amplifier, which controls the gate voltage of the path switch based on a voltage drop across the current sense resistor to perform current-limited soft start;

a slope detection circuit, coupled to the output voltage, for monitoring the rising slope of the output voltage; and a pull-down switch, coupled between the gate of the path switch and a disabling potential;

wherein when the slope detection circuit detects that a rising slope of the output voltage is below a preset slope threshold, the pull-down switch is triggered to conduct, thereby turning off the path switch.

2. The switch control circuit of claim 1, further comprising:

a charge pump, after completing the soft start, configured to raise the gate voltage of the path switch to a high potential generated by the charge pump, thereby fully turning on the path switch.

3. The switch control circuit of claim 1, wherein the slope detection circuit includes:

an analog-to-digital converter (ADC) coupled to the output voltage, which converts the output voltage into a digital signal; and a logic circuit, which calculates the rising slope of the output voltage based on the digital signal and compares the rising slope with the preset slope threshold to generate a control signal for controlling the pull-down switch.

4. The switch control circuit of claim 1, wherein the switch control circuit allows the rising slope of the output voltage to be below the preset slope threshold within a preset time window, thereby achieving a deglitch function.

5. The switch control circuit of claim 1, wherein upon detecting that the rising slope of the output voltage is below the preset slope threshold and turning off the path switch, the switch control circuit attempts a soft restart after a preset time delay.

6. The switch control circuit of claim 1, wherein the switch control circuit counts and records a number of soft-start re-attempts, and when the number of the soft-start re-attempts reaches a preset limit, maintains the path switch in an off state.

7. A switch circuit, comprising:

a path switch and a current sensing resistor connected in series between an input voltage and an output voltage; and a switch control circuit, including:

an amplifier, configured to control the gate voltage of the path switch based on a voltage drop across the current sensing resistor to perform current-limited soft start;

a slope detection circuit coupled to the output voltage, for monitoring the rising slope of the output voltage; and a pull-down switch connected between the gate of the path switch and a disabling potential;

wherein, when the slope detection circuit detects that the rising slope of the output voltage is below a preset slope threshold, the pull-down switch is triggered to conduct, thereby turning off the path switch.

8. The switch circuit of claim 7, further comprising:

a charge pump, configured to, after completing the soft start, raises the gate voltage of the path switch to a high potential generated by the charge pump, thereby fully turning on the path switch.

9. The switch circuit of claim 7, wherein the slope detection circuit includes:

an analog-to-digital converter (ADC) coupled to the output voltage, which converts the output voltage into a digital signal; and a logic circuit that calculates the rising slope of the output voltage based on the digital signal and compares it with the preset slope threshold to generate a control signal for controlling the pull-down switch.

10. The switch circuit of claim 7, wherein the switch control circuit allows the rising slope of the output voltage to be below the preset slope threshold within a preset time window, thereby achieving a deglitch function.

11. The switch circuit of claim 7, wherein upon detecting that the rising slope of the output voltage is below the preset slope threshold and turning off the path switch, the switch control circuit re-attempts the soft start after a preset time delay.

12. The switch circuit of claim 7, wherein the switch control circuit counts and records a number of soft-start re-attempts, and when the number of the soft-start re-attempts reaches a preset limit, maintains the path switch in an off state.

13. A method for controlling a path switch connected in series between an input voltage and an output voltage, the method comprising:

controlling a gate voltage of the path switch to perform a current-limited soft start of the output voltage;

monitoring a rising slope of the output voltage;

comparing the monitored rising slope with a preset slope threshold; and turning off the path switch when the rising slope is lower than the preset slope threshold.

14. The method of claim 13, further comprising: allowing the rising slope to be lower than the slope threshold within a preset time window during the soft start.

15. The method of claim 13, further comprising: after turning off the path switch due to the rising slope being lower than the preset slope threshold, re-attempting the soft start after a preset time delay.

16. The method of claim 13, further comprising: counting and recording a number of soft-start re-attempts; and maintaining the path switch in an off state when the number of the soft-start re-attempts reaches a preset limit.

* * * * *